United States Patent
Lecce

(10) Patent No.: US 10,982,785 B2
(45) Date of Patent: Apr. 20, 2021

(54) CIRCUIT FOR CONTROLLING THE CURRENT IN INDUCTIVE LOADS AND CONTROL METHOD THEREFOR

(71) Applicant: STMICROELECTRONICS S.R.L., Agrate Brianza (IT)

(72) Inventor: Sergio Lecce, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 563 days.

(21) Appl. No.: 15/793,464

(22) Filed: Oct. 25, 2017

(65) Prior Publication Data
US 2018/0283570 A1  Oct. 4, 2018

(30) Foreign Application Priority Data
Mar. 28, 2017  (IT) .................. 102017000034070

(51) Int. Cl.
| | |
|---|---|
| *F16K 31/06* | (2006.01) |
| *H01H 47/32* | (2006.01) |
| *H01F 7/18* | (2006.01) |
| *B60T 8/176* | (2006.01) |
| *B60T 17/04* | (2006.01) |
| *H01F 7/06* | (2006.01) |
| *H03K 7/08* | (2006.01) |

(52) U.S. Cl.
CPC .............. *F16K 31/06* (2013.01); *B60T 8/176* (2013.01); *B60T 17/04* (2013.01); *H01F 7/064* (2013.01); *H01F 7/1844* (2013.01); *H01H 47/325* (2013.01); *H03K 7/08* (2013.01); *B60T 2270/10* (2013.01); *H01F 2007/1888* (2013.01)

(58) Field of Classification Search
CPC .......... F16K 31/06; B60T 8/176; B60T 17/04; B60T 2270/10; H03K 7/08; H01F 7/064; H01F 7/1844; H01F 2007/1888; H01H 47/325
USPC ....................................................... 361/152
See application file for complete search history.

(56) References Cited

U.S. PATENT DOCUMENTS

| | | | |
|---|---|---|---|
| 7,235,946 B2 | 6/2007 | Park | |
| 7,872,845 B2 | 1/2011 | Williams et al. | |
| 2004/0095020 A1* | 5/2004 | Kernahan | H02M 3/156 307/35 |

(Continued)

FOREIGN PATENT DOCUMENTS

JP    2014-096409 A    5/2014

*Primary Examiner* — Kevin J Comber
(74) *Attorney, Agent, or Firm* — Seed IP Law Group LLP

(57) ABSTRACT

A circuit for controlling current in an inductive load is provided. The circuit includes a driver circuit for driving a load current in the inductive load. The driver circuit includes a switch, which is switched on to increase the load current and a recirculation diode, which re-circulates the load current when the switch is off. The circuit includes a control module that generates a control signal to switch on and off the switch. The control module includes a PWM current controller comprising a negative feedback closed loop implementing at least a proportional control and an integral control. The PWM current controller receives a target current value and an estimated current flowing in the load during a measurement PWM cycle. The PWM current controller generates the control signal for a control input of the switch based on an error between the target current and the estimated current.

11 Claims, 7 Drawing Sheets

(56) References Cited

U.S. PATENT DOCUMENTS

| | | |
|---|---|---|
| 2004/0120094 A1 | 6/2004 | Satoh |
| 2006/0152185 A1* | 7/2006 | Park .................... H01H 47/325 |
| | | 318/599 |
| 2008/0238391 A1* | 10/2008 | Williams ............. H01F 7/1844 |
| | | 323/283 |
| 2009/0015979 A1 | 1/2009 | Fukano et al. |
| 2009/0085544 A1 | 4/2009 | Hartlieb |

* cited by examiner

FIG. 1 *(Prior Art)*

CIRCUIT FOR CONTROLLING THE CURRENT IN INDUCTIVE LOADS AND CONTROL METHOD THEREFOR

BACKGROUND

Technical Field

The present disclosure relates to controlling the current in inductive loads, such as electro-mechanical valves comprising a coil. The present disclosure also relates to using a driver circuit to drive a load current in the inductive load, and in particular a driver circuit including a controllable switch having a pair of low side and a high side driving switches that are controlled to increase a load current flowing in the inductive load and by configuring a recirculation diode to re-circulate the load current when the controllable switch is switched off, said controlling circuit including a control module generating a control signal to switch on and off the controllable switch.

Description of the Related Art

In several automotive applications, such as Anti-lock Braking Systems (ABS), Transmissions Control and others, an accurate and linear control of the current flowing through a valve device is desirable. Here with valve or valve device it is made reference to an electro-mechanical element including a coil around a ferromagnetic core. When a current is flowing through such coil, the magnetic field generated produces a force on the core that is opposed by a spring and that causes core movement. Depending on the kind of valve, this movement can be used to open/close a hydraulic circuit, move mechanical gear or for other mechanical purposes. Since the final displacement of the core depends on the current flowing through the coil, depending on the system requirements, an accurate current control is often desirable. From an electrical point of view, the valve, mainly because of the coil, corresponds to an inductive load. A very simplified electrical model of an electro-mechanical valve is represented by a series of a resistance and an inductance, although the real valve electrical behavior can be significantly different, as will be discussed in the following.

A widely used technique to control the average current flowing through an inductive load, such as the one represented by an electro-mechanical valve, makes use of a PWM (Pulse Width Modulation) driving signal.

By way of example, in FIG. 1 a circuit 10 for controlling the current in a valve 50 is shown. The circuit 10 is embodied by an integrated circuit with three pins for connection to the inductive load, corresponding to nodes VB, OUT and PNGD, which be described in more detail in the following. The circuit 10 for controlling the current, includes a PWM current controller module 15 which generates PWM control commands CMD to control operation of a current driver of the load represented by the valve 50, which is embodied here by a switching driver module 18. The PWM current controller module 15 operates, for instance, as a closed loop proportional-integral controller, implementing a proportional-integral transfer function. The transfer function can be also a proportional-integral-derivative between its inputs and outputs. The PWM current controller module 15 is usually integrated in a generic Smart-Power ASIC device. The circuit 10 for controlling the current then includes the half bridge switching module 18 which, in FIG. 1, is in a low-side configuration. The switching driver module 18 includes a pair of switches, embodied by MOSFETs, with a low side switch 11, source-connected to a ground PGND, so that is connected between the load 50 and the ground PNGD, and a high side switch 12 drain-connected, at a corresponding battery node VB, to a supply rail, represented by a battery voltage $V_{BATT}$, so that it is connected between the supply rail VB and the load 50. The drain electrode of the low side switch 12 is connected to the source of the high side switch 11, forming an output node OUT. The load, i.e., the valve 50, is connected between the battery voltage $V_{BATT}$ and the output node OUT. Each switch 12 and 11 has a respective gate driver 12a and 11a, forming with the corresponding switch a respective drive chain for the load 50, to drive its gate with a respective command signal CMD and CMD, i.e., the command signal of the high side switch 11 is a negation of the command signal of the low side, which originates from the PWM current controller module 15. For a high-side configuration, a dual arrangement can be applied in a way known per se to the person skilled in the art.

In the valve 50 shown in FIG. 1, represented by a series of a resistance $R_{LOAD}$ and an inductance $L_{LOAD}$, flows a load current $I_{LOAD}$.

Shown in FIG. 2 are time diagrams representing different currents flowing in circuit 10 as a function of time t. The command signal CMD has ON and OFF states whose time length is controlled by the PWM controller 15. When the signal CMD is in the ON period, the load current $I_{LOAD}$ through the valve 50 is increasing and corresponds to a low side current $I_{LS}$ through the low switch 11. When the signal CMD is in the OFF period, a so-called recirculation current, which corresponds to a high side current $I_{HS}$ through the high side switch 12, flows through the valve 50 decreases in value. Both the integrated drivers 11, 11a and 12, 12a are provided with a corresponding current sensing circuit 11b, 12b, which allow for measuring the current flowing through the valve 50, in both the ON and OFF periods, i.e., the low side current $I_{LS}$ and the high side current $I_{HS}$, with the exception of short time intervals, during the ON-OFF transitions. The sensing circuit 11b, 12b can be embodied for instance by a sense amplifier. The controller 15 receives as input a sensing current $I_{sense}$ that is the sum, performed in a sum node 13, of the current sensed by the low and high side driver. The controller 15 receives also as input a target current $I_{target}$, which is set by the user or external control modules, which represents the set-point of the controller 15, and a PWM period $T_{PWM}$. From the point of view of the control, the controller 15 uses the target current $I_{target}$ as the set-point, the sensing current $I_{sense}$ as the feedback quantity, and the error between the target current $I_{target}$ and the sensing current $I_{sense}$ feeds the proportional integral block, which in its turn feed the PWM block modulating the PWM period $T_{PWM}$ according to the value obtained by the proportional integral block. Therefore, the circuit 10 allows for implementing an accurate average current control in a wide range of PWM periods and duty-cycle driving conditions. The availability of the load current measurement in almost all the PWM time period, allows for integrating a current control algorithm that is able to guarantee that the average load current $I_{load}$ is regulated to match the target value $I_{target}$ with very good accuracy and independently from the real load current shape. Even if, applying the L-R series model for the load 50, the shape is different from the one ideally expected, the current is continuously measured by the sensing circuits 11a, 12a and integrated in the module 15 in order to correctly control the real average value.

The draw-back of solutions like the one depicted in FIG. 1 is the cost of the controlling device, where two silicon area consuming power stages are needed, with the related current-sensing circuitry, which should have a good matching characteristic, and three pins or terminals for each load, i.e., the terminals indicated as VB, OUT and PGND in FIG. 1. In modern ASIC devices, when integrating a huge number of functions and drivers, pin count can be a limiting factor.

Solutions are also known which are less accurate than the one described with reference to FIG. 1, but are suitable to specific automotive application, such as ABS Systems, where a great number of valves can be present and are sought to be driven, but not all of them require the same level of current control accuracy. Depending on their purpose with respect to the hydraulic system, some of them can be simply ON-OFF driven or can be PWM driven with a less tight current control, i.e., the current control can implement a lower absolute current accuracy and/or the current can be measured/monitored only on a longer time period basis, i.e., not within a single PWM period.

To this regard, shown in FIG. 3 is a circuit 20 for controlling the current in a valve 50 exemplary of such solutions implementing less accurate control. Same reference number refers to components with the same function. Such circuit 20 for controlling the current in a valve 50 includes an integrated circuit 20a, in particular an ASIC (Application Specific Integrated Circuit) and an external recirculating diode 22. Only the low-side integrated driver 11, 11a and its related current-sense circuitry 11b are present here, with two pins, node OUT and node PGND of the integrated circuit 20a, for driving the load current $I_{load}$, while the recirculation current of the valve 50 is driven by an external, i.e., external with respect to the integrated circuit 20a, low-cost diode 22, which is connected between the output node OUT, i.e., the drain of the low side switch 11, and the battery node VB, connected to battery voltage $V_{BATT}$.

Therefore, such circuit 20 for controlling the current in a valve 50 can be regarded as including a pair of low side and a high side driving switches, which are however in this case obtained by a controllable switch, the low-side MOSFET switch 11, which is switched on to increase a load current flowing in the inductive load 50, and by the recirculation diode 22, which can be considered a high-side switch, although not a switch that is controllable by a control signal, arranged to re-circulate the load current $I_{load}$ when the controllable switch, i.e., MOSFET 11, is switched off. As mentioned before, the recirculation diode 22 is external with respect to the integrated circuit 20a, this being a relevant feature as it reduces the cost of the integrated circuit 20a. The recirculation diode 22 is connected in parallel to the load 50, with the anode connected to the output node and the cathode connected to the battery voltage $V_{BATT}$, so that when the MOSFET 11 is OFF, i.e., the switch is open, the recirculation diode 22 is direct conducting, recirculating the load current $I_{load}$ flowing through the load toward the battery, while when the MOSFET 11 is ON, i.e., the switch is closed, the recirculation diode 22 is inversely biased.

In such a circuit topology the load current $I_{load}$, when flowing through the external recirculation diode 22 as diode current $I_{diode}$, since the low-side switch 11 is off and the low side current $I_{LS}$ is equal to zero, cannot be measured by the control circuit and therefore the real average current $I_{average}$ with respect to the load current $I_{load}$ cannot be measured, since only the low side current $I_{LS}$ is measurable.

Therefore, such a circuit it is operated as follows.

The integrated driver 11, 11a, as shown in the corresponding time diagrams shown in FIG. 4, receives a direct control command signal CMD signal from a microcontroller 25, which is external with respect to the ASIC 20a, on a input pin CN corresponding to the input node of the gate driver 11a, and sends back a current feedback $I_f$ to the microcontroller 25 via a SPI (Serial Parallel Interface) communication. The current feedback $I_f$ is measured at half of the ON period, Ton, during the i+1-th cycle i+1. During each i-th PWM period, the ON period Ton is measured by the less accurate circuit 20 in a measurement module 28 and sampled, by a sample and hold module 26, at the instant $Ton_i/2$ of the subsequent PWM cycle i+1, the load current $I_{load}$, to provide the current feedback value $I_f$, through an analog to digital converter 27, to the microcontroller 25. Therefore, the subsequent PWM cycle i+1 is the contemporary measurement cycle, i.e., the real time cycle with respect to the loop operation, in which the load current is sensed. However, the current feedback value $I_f$ is calculated or measured using the cycle value of the previous PWM cycle i of ON time, $Ton_i$. Such current feedback value $I_f$ differs from the real average current value flowing through the valve 50. However this cannot be avoided, since the complete trend of the load current $I_{load}$ is not available inside the integrated circuit 20, if the OFF current is not measured to save costs.

There is, therefore, a trade-off between accuracy and cost. The current feedback $I_f$ can be used by the microcontroller 25 just to monitor the current or to implement a current control algorithm. Although a current-control algorithm operating on a PWM-period basis could be implemented, this would require quite a heavy SPI traffic load, that can be hardly sustained. Further, an important limitation for this driving topology is due to the very limited accuracy at low average currents. When a low average current is the target, a very small duty cycle has to be applied through the command signal CMD, limiting the period when the current can be sensed by the circuit 20 to a very low percentage of the total period. This is made worse by the non-sensing intervals of the current sense circuit 11b during the ON-OFF transitions of signal CMD, to guarantee that a reliable value can be provided as measured current, and, most important, by the non-linear behavior of the real valve 50, that differs significantly from the "smooth" trend of a simple L-R series model.

Due to all the limitations described here above, the circuit arrangement shown in FIG. 3 is limited to be used for valves requiring quite poor current control accuracy.

BRIEF SUMMARY

Provided in the present disclosure are solutions which overcome one or more of the above drawbacks.

According to one or more embodiments, a circuit for controlling the current in inductive loads is provided. Embodiments moreover concern a corresponding control method.

As mentioned before, the present disclosure relates to a circuit for controlling the current in inductive loads, in particular electro-mechanical valves including a coil. The circuit includes a driver circuit to drive a load current in the inductive load. The driver circuit includes, in an integrated circuit portion of the driver circuit, a low side or high side driving switch obtained by a controllable switch, such as a MOSFET, and which is switched on to increase a load current flowing in the inductive load. The load current is also driven by a recirculation diode, external with respect to the integrated circuit portion of the driver circuit, arranged to re-circulate the load current when the controllable switch is switched off. The controlling circuit includes a control module generating a control signal to switch on and off the controllable switch. The control module includes a PWM (Pulse Width Modulation) current controller module including a negative feedback closed loop that include a module implementing at least a proportional control action and an integral control action feeding a PWM modulator module. The PWM current controller module receives, as feedback loop set-point, a target current value and, as feedback measured value of the loop, an estimated value of the current flowing in the load during a measurement PWM cycle. The PWM current controller module is configured to generate the control signal for a control input of the controllable switch on the basis of an error between the target current and the estimate of the current flowing in the load.

In various embodiments, the circuit includes a controllable switch that is a low side switch coupled between an output node and a ground node. The recirculation diode may be coupled connected to a battery node and in parallel with respect to the inductive load.

In various embodiments, the circuit includes a sense circuit, such as a sense amplifier, that is coupled to the switch to sense the load current and supply a sense current to a module performing the estimation of the current of the current flowing in the load.

In various embodiments, the estimate of the current flowing in the load is calculated as half of the sum of a low current value acquired after the PWM current controller module issued a ON command signal for the switch and a high current value acquired before the end of the previous ON command signal.

In various embodiments, the module implementing at least a proportional control action and an integral control action implements also a derivative action.

A method for controlling the current in inductive loads, such as electro-mechanical valves comprising a coil, is disclosed. The method includes driving a load current in the inductive load by a pair of low side and a high side driving switches obtained by a controllable switch, such as a MOSFET. The controllable switch is switched on to increase a load current flowing in the inductive load. A recirculation diode is arranged to re-circulate the load current when the controllable switch is switched off. The method includes generating a control signal to switch on and off the controllable switch. Generating the control signal to switch on and off the controllable switch includes performing a PWM (Pulse Width Modulation) current control by a negative feedback closed loop, implementing at least a proportional control action and an integral control action and PWM modulation, using as feedback loop set-point a target current value and as feedback measured value of the loop an estimated value of the current flowing in the load during a measurement PWM cycle. The method includes generating the control signal for a control input of the controllable switch on the basis of an error between the target current and the estimate of the current flowing in the load.

In various embodiments, the method includes using as controllable switch a low side switch coupled between an output node and a ground node and connecting the recirculation diode to a battery node in parallel with respect to the inductive load.

In various embodiments, the method includes sensing the current in the controllable switch to sense the load current and estimating on the basis of said sense current said estimated value of the current flowing in the load during a measurement PWM cycle.

In various embodiments, estimating, on the basis of the sense current, the estimated value of the current (flowing in the load during a measurement PWM cycle) includes calculating half of the sum of: a low current value acquired after the issuance of an ON command signal in the measurement PWM cycle and a high current value acquired just before or synchronously with the issuance of an OFF command signal.

In various embodiments, the low current value is acquired from the sense current after the issuance of an ON command signal in the measurement PWM cycle evaluating when the controllable switch closes, in particular after the settling of the sense current, In various embodiments, the high current value is acquired just before or synchronously with the issuance of an OFF command signal evaluating when the controllable switch is open. In various embodiments, a median current value is calculated as the sum of the low current and the high current divided by two.

In various embodiments, the method includes preventing sampling the high current value or low current value if the duty cycle of the PWM control signal is 100%.

In various embodiments, the module implementing at least a proportional control action and an integral control action also implements a derivative action.

BRIEF DESCRIPTION OF THE SEVERAL VIEWS OF THE DRAWINGS

Embodiments of the present disclosure will now be described with reference to the annexed drawings, which are provided purely by way of non-limiting example and in which.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not limit the scope or meaning of the embodiments.

Figure 5:
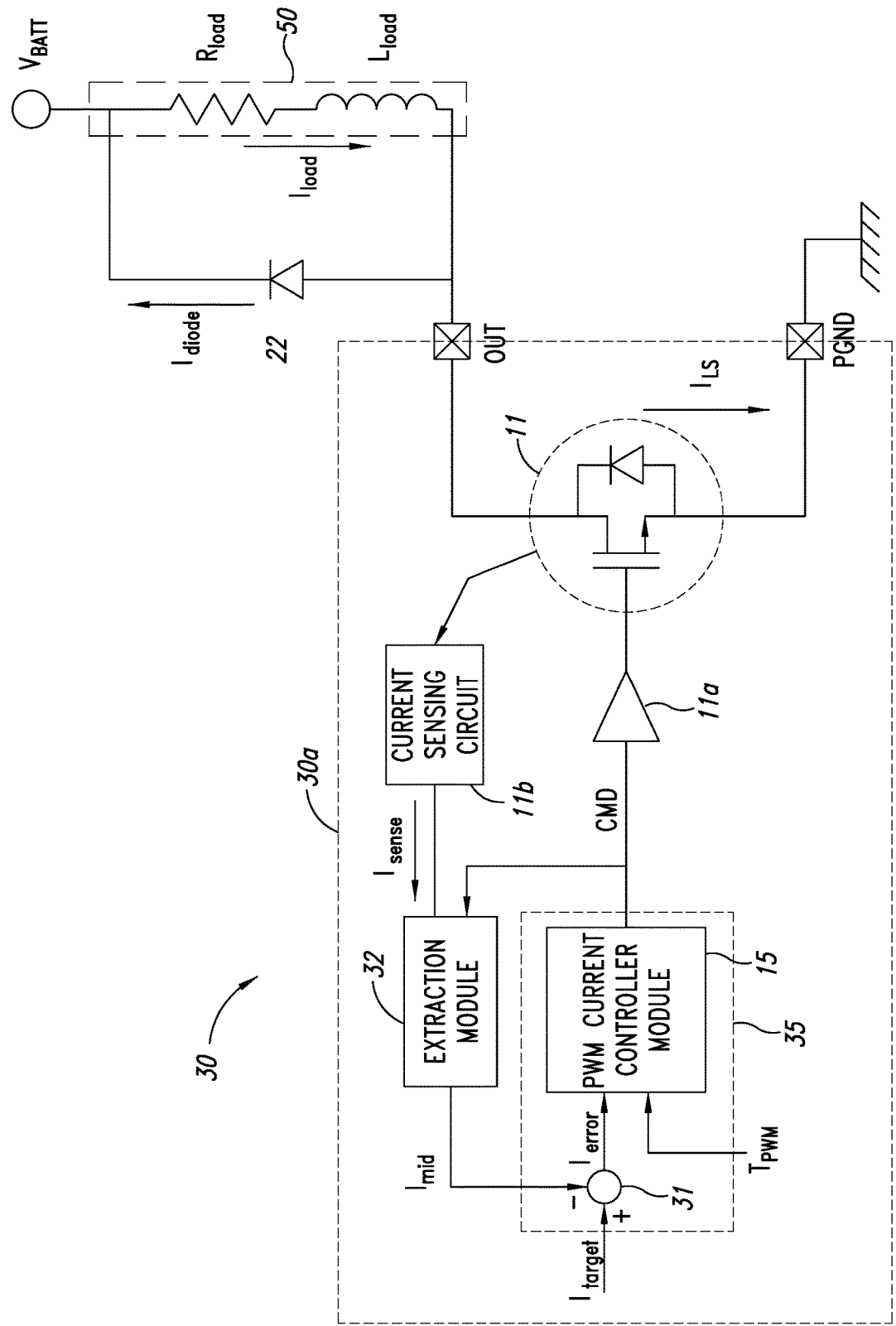
FIG. 5 shows schematically an embodiment of a control circuit of the type here described.

In FIG. 5 described is a solution for controlling the current in inductive loads that obtains a sufficient accuracy and a real time current, using a single switch, in particular a low side switch represented by a current control circuit 30. Such a solution provides in the current control circuit 30 a PWM current controller configured to regulate the load current in real time. Regulation in real time means regulation within a single PWM period, without requiring a high microprocessor work-load. A current feedback value for the PWM current controller to be compared with the target current value is extracted that minimizes the current error with respect to the real average current, taking in account also the real valve current shape. An integrated circuit 30a comprising an integrated current control loop with an external recirculation diode is used. Different possible control strategies are described to compute the feedback current value to be compared with target value, based on the available ON-current measurement.

As shown in FIG. 5, the control circuit 30 presents substantially the same circuit arrangement of the control circuit 20, having an integrated circuit 30a including a single low side switch 11 having the load 50 connected between the output node OUT, which corresponds to the drain electrode of the low side switch 11, and the battery voltage $V_{BATT}$. The recirculation diode 22, external with respect to the integrated circuit 30a, is connected between the same nodes, OUT and $V_{BATT}$, to conduct directly the current into the battery node $V_{BATT}$.

Figure 1:
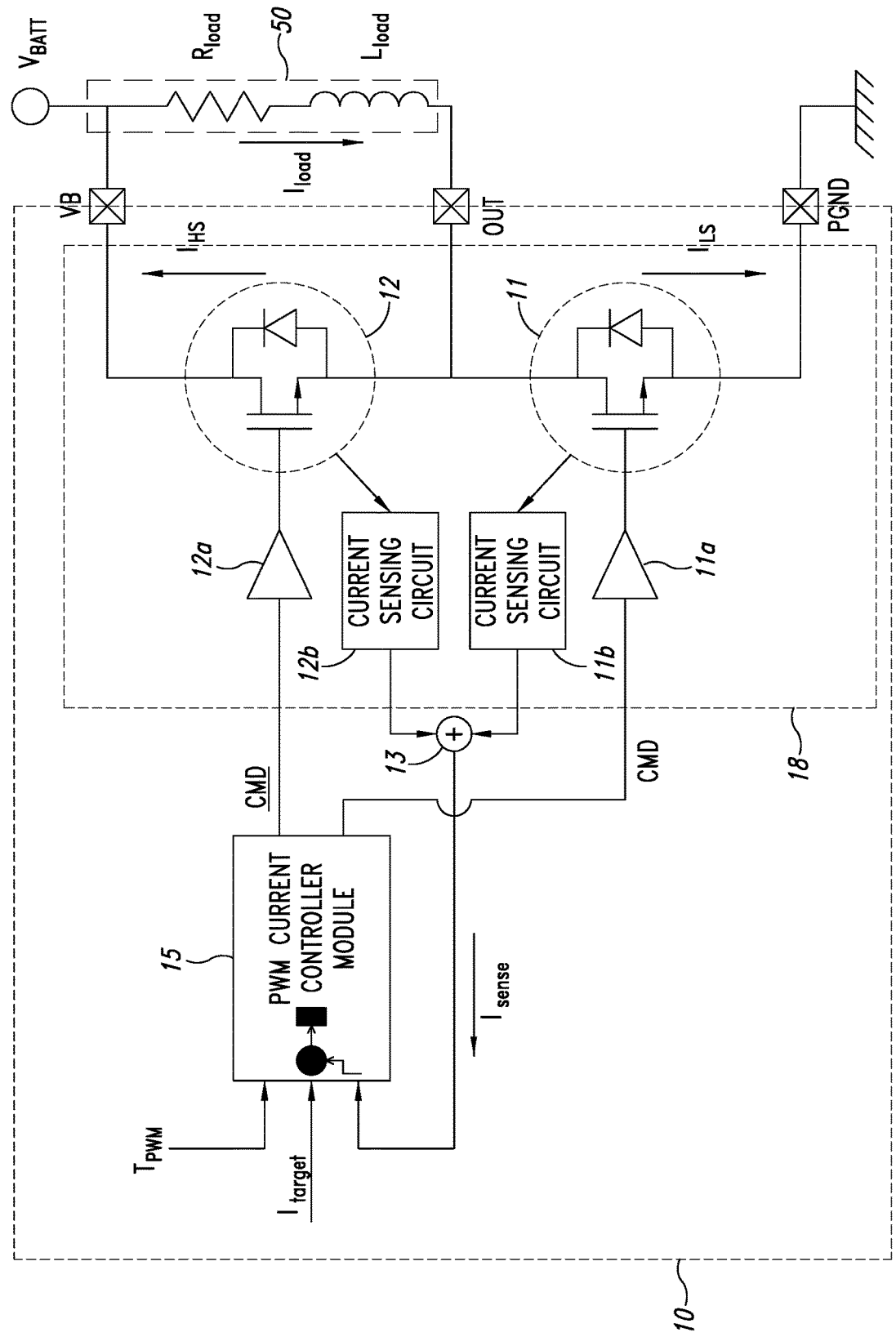
FIG. 1, 2, 3, 4 have been already described in the foregoing.
Figure 2:
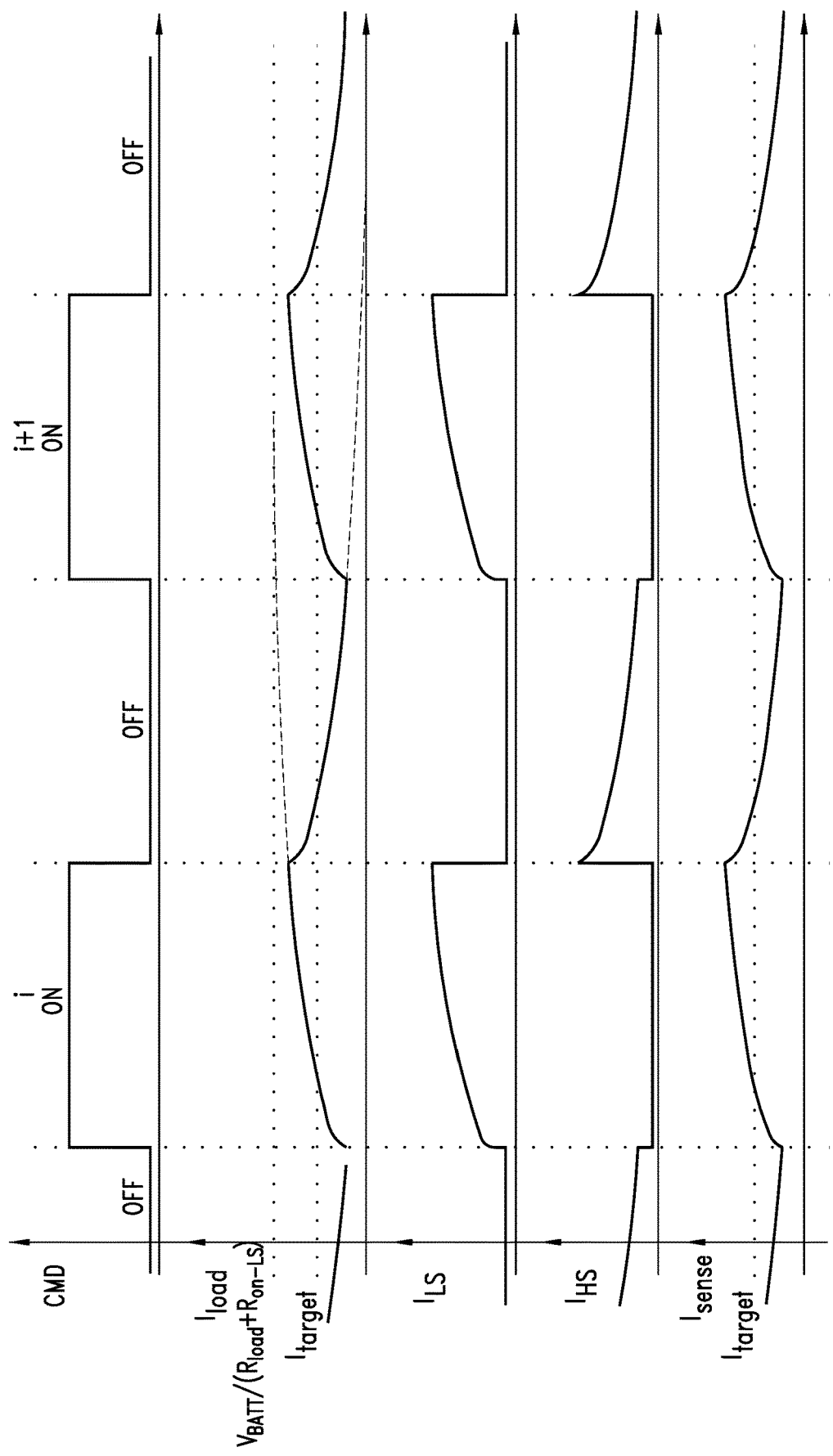
Figure 3:
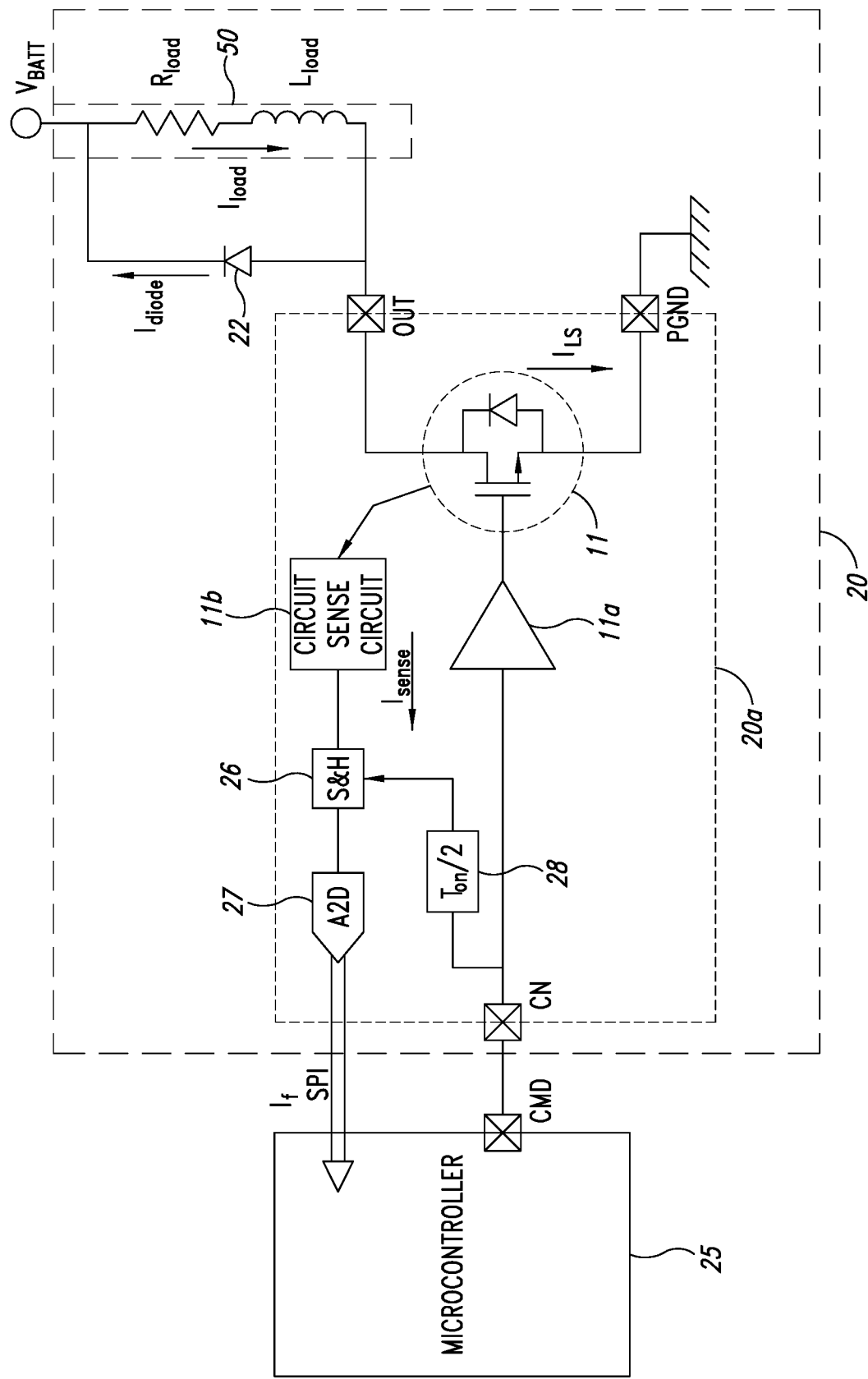
Figure 4:
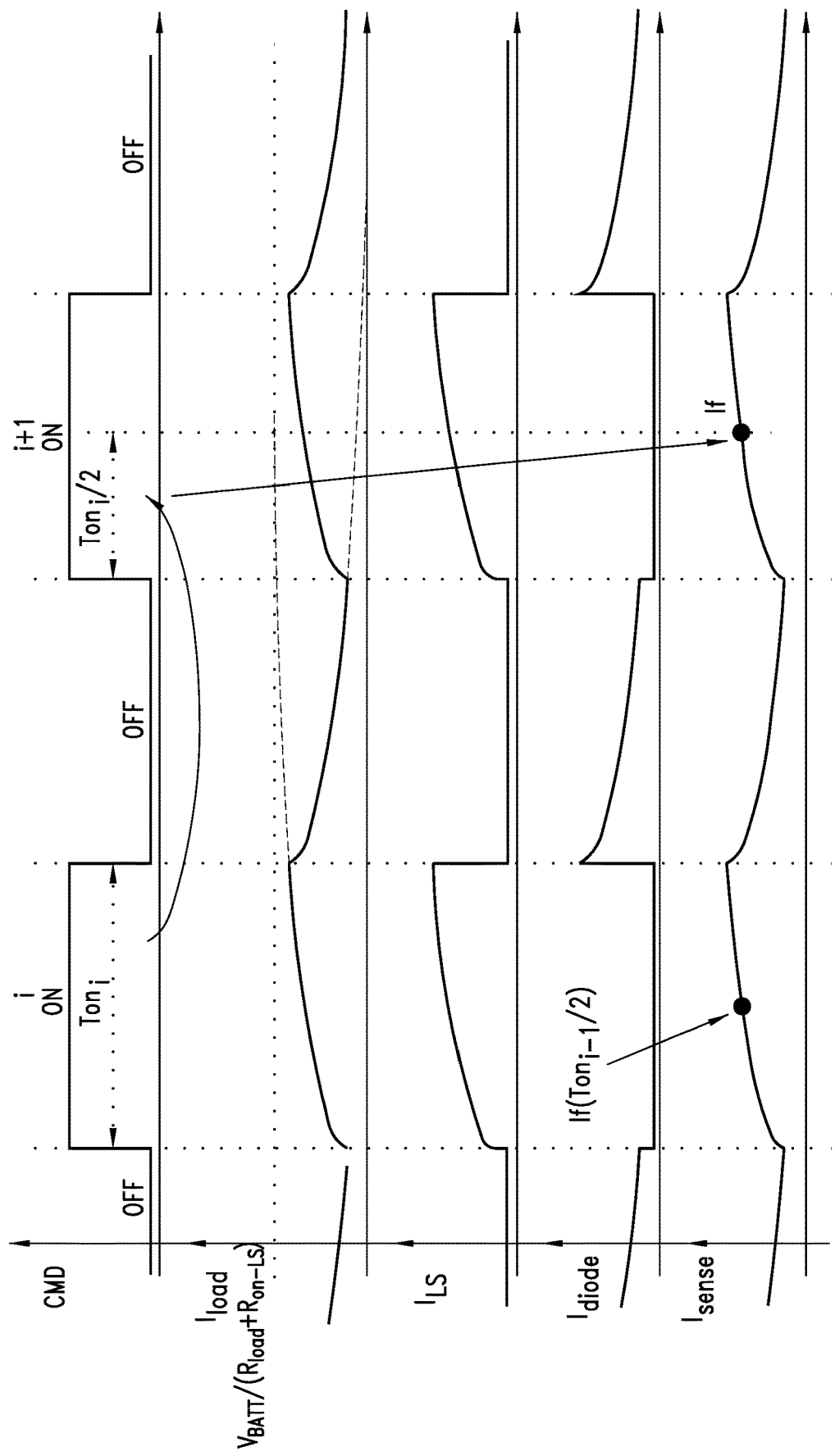

In this case, differently from the circuit 20 shown in FIG. 3, the command signal CMD is issued by the controller 15, which is included in a current controller module 35, included in the integrated circuit 30a, which receives as one of its inputs the PWM period $T_{PWM}$. The set-point input of the controller 15, however, receives an error current $I_{error}$ computed as the difference, which is performed in a specific sum module 31 also included in the current controller module 35, between the target current $I_{target}$ and a median current $I_{mid}$. Such median current $I_{mid}$ is measured in a median current extraction module 32, which receives the sense current $I_{sense}$ from the sense circuit 11b and the command signal CMD as inputs.

The integrated circuit 30a, therefore, in the embodiment shown above includes the current controller module 35, the driver 11, 11a, the median current extraction module 32, and the current sensing circuit 11b.

Figure 6:
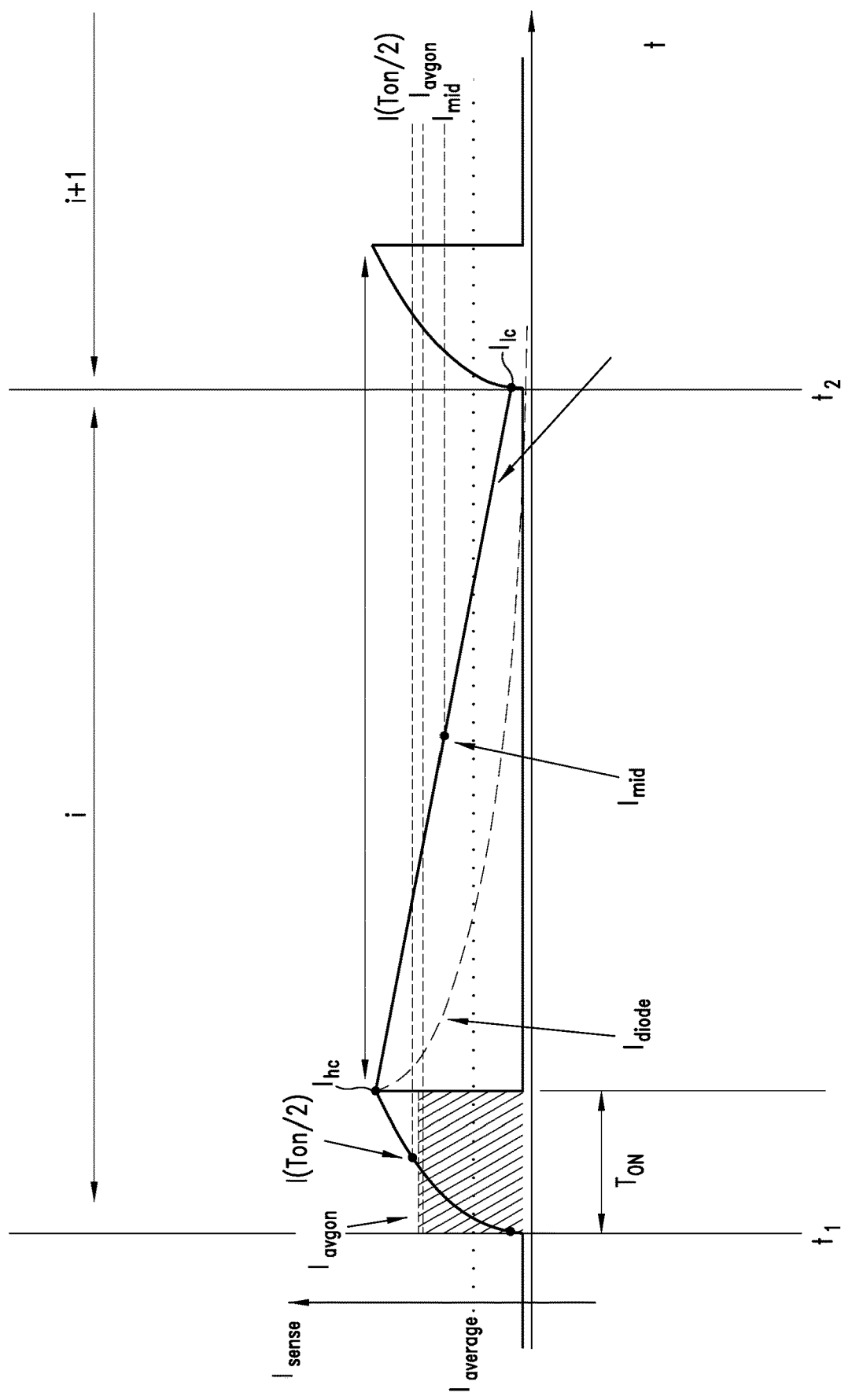
FIG. 6 shows a time diagram representing currents and values used by the control circuit of FIG. 5.

With reference to FIG. 6, shown is a diagram of the current $I_{sense}$ as a function of time t, the median current $I_{mid}$ extracted by the median current extraction module 32 can be calculated on the basis of the sense current $I_{sense}$, corresponding to the low side current $I_{LS}$, preferably as follows. A first PWM cycle, is defined from when the PWM control signal CMD goes from the OFF to the ON state, starting an ON period $Ton_i$, and from the subsequent OFF period $Toff_i$. A subsequent PWM cycle i+1 is defined as measurement cycle, since, as better detailed during this cycle the median current $I_{mid}$ is calculated and feed to the node 31 to calculate the error current $I_{error}$ updating the input of the controller 15, therefore varying the length of the on period $Ton_{i+}$ of the measurement cycle i+1.

The median current $I_{mid}$ is obtained by computing an average value between a high current value $I_{hc}$ measured when it occurs that the PWM control signal CMD goes from the ON to the OFF state, marking in FIG. 6 the beginning of the first PWM cycle i. The ON period $Ton_i$ of the first PWM cycle i is shown with its area in slanted lines. A low current value $I_{lc}$ is sampled or acquired when it the PWM control signal CMD goes from the OFF to the ON state at the end of the first PWM cycle i. The low current value $I_{lc}$ of the current $I_{sense}$ is acquired as soon as the switch 11 is fully ON and the current sense amplifier embodying the sense circuit 11b is settled to guarantee correct current measurement. The median current $I_{mid}$ is, therefore, obtained in the measurement cycle i+1, as soon as the low current value $I_{lc}$ is measured at the beginning of the cycle i+1, averaging it with the high current $I_{hc}$ which is read at the end of the cycle i using immediately the median current $I_{mid}$ to update the PI controller 15 computing the value of the ON time $Ton_{i+1}$ of the measurement cycle i+1 itself.

In FIG. 6, where it shown a line corresponding to the average current value $I_{average}$, i.e., the real average value of the periodic current in the load, are indicated other quantities that can be computed by the module 32 as median current $I_{mid}$ value. A possible choice is the average ON current value $I_{avgon}$, i.e., the average value of the ON current. Another possible choice is the sense current value at $T_{on}/2$, $I(T_{on/2})$.

In typical driving conditions and with an RL series valve model, where the current ripple shape is very similar to a triangular wave ($T_{ON}$ and $T_{OFF}$ being lower than load time constant), these three alternative choices (the median current $I_{mid}$, the average ON current value $I_{avgon}$, and the sense current value at $T_{on}/2$, $I(T_{on/2})$) are almost equivalent since all these three choices supply values that are very near to the true average current $I_{average}$. Current ripple measurements on a real valve installed in the complete application environment and driven at different target currents show a current ripple shape that is not fitting with the single time constant behavior provided by a simple R-L series model. In particular, the real current behavior shows a high slope as soon as the driver is turned on or off, while the current slope decreases as the on/off state is kept—it has to be fitted using therefore different time constants. The reason for this behavior seems to be the ferromagnetic characteristics of the valve core with its hysteresis and saturation.

Due to this non-linear behavior of the current ripple, the method based on the median current $I_{mid}$ provides the lowest error in in a wide target current range.

It has to be underscored that in FIG. 6, for the median current $I_{mid}$, the point placed at half the OFF period of cycle i simply indicates the value of the median current $I_{mid}$ on the vertical axis so that such value of the median current $I_{mid}$ can be also graphically compared to the other estimates of the current and with respect to the average current $I_{average}$. However, the median current $I_{mid}$ is computed at time t2 in the cycle i+1, and the solid line passing through the median current $I_{mid}$ point is just drawn to facilitate illustration.

Figure 7:
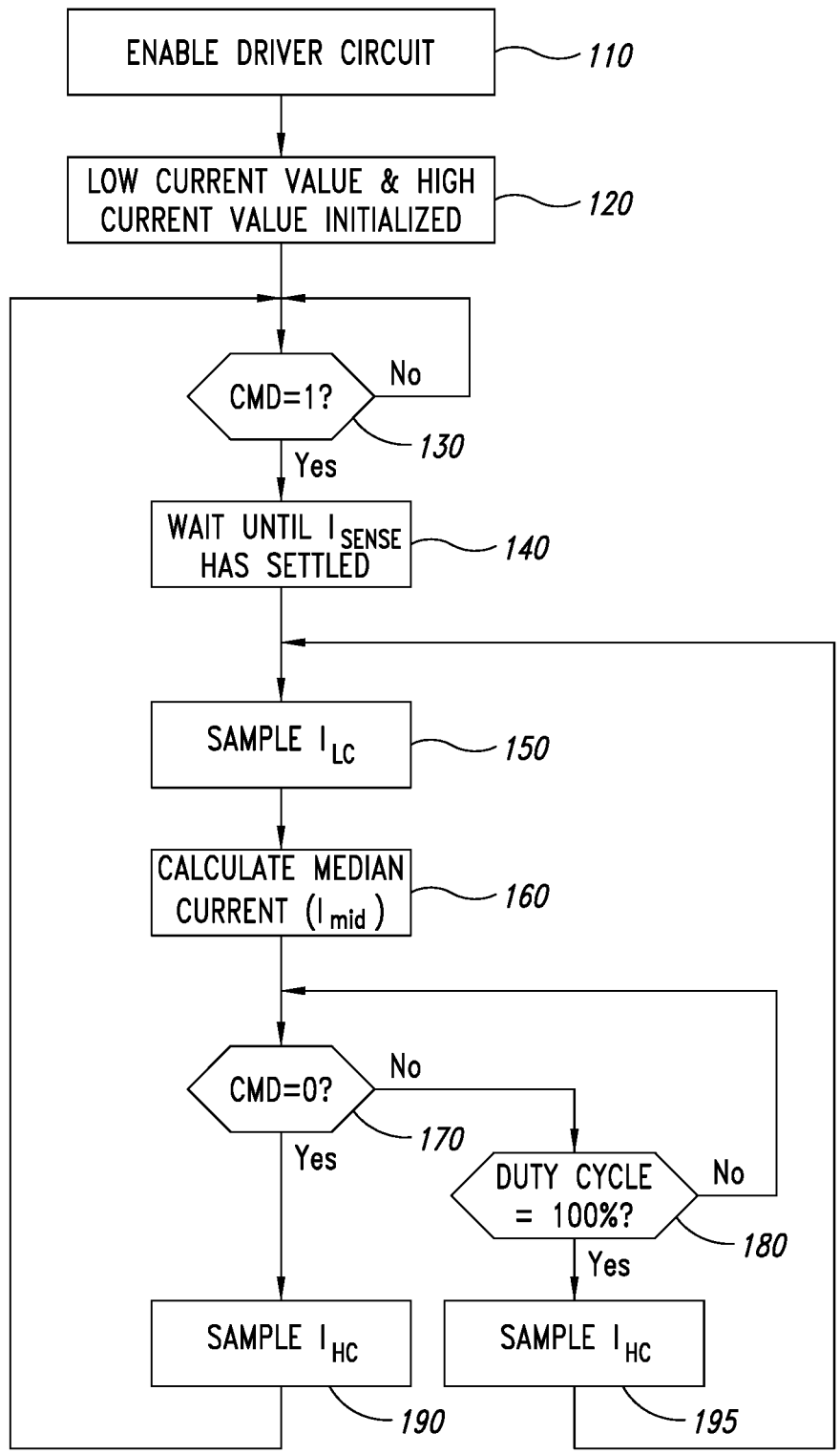
FIG. 7 shows a flow diagram representing an embodiment of a method implemented by the circuit of FIG. 5.

FIG. 7 shows a flow diagram representative of an embodiment of a method.

In step 110, the driver circuit 30 is enabled.

In step 120, variables corresponding to the low current value $I_{lc}$ and the high current value $I_{hc}$ are initialized to the zero value.

In step 130 it is evaluated if the command signal CMD is logic one, i.e., the switch 11 is closed and the current $I_{LS}$ is passing through the load 50. In the negative, i.e., command signal CMD=0, control is brought back to step 120, i.e., the method cycles around the evaluation step 130 until the command signal CMD closes the switch 11.

Therefore if a positive determination is made, step 140 of waiting for the settling of the sense current $I_{sense}$ after the switching on of switch 11 is performed. This can be performed by setting a settling time of the current sense 11b.

After the step 140, at step 150 the low current value $I_{lc}$ is sampled.

Then in step 160 the median current $I_{mid}$ value is calculated, in particular as the sum of the low current $I_{lc}$ and the high current $I_{hc}$ divided by two, i.e., $$I_{mid} = (I_{lc} + I_{hc})/2$$

In step 160, the updating of the median current $I_{mid}$ value includes updating the input corresponding to the error current $I_{error}$ of the controller 15, which determines the calculation of a new ON time ($T_{ON}$) for the PWM cycle taking place.

Then in step 170, it is evaluated if the command signal CMD is logic zero, i.e., the switch 11 is open and the load 50 current is no longer passing through the low-side driver.

In the affirmative, the high current $I_{hc}$ value is sampled in step 190 and control returns to step 120. Since the digital control is much faster than the low-side driver, the acquired or sampled value of high current $I_{hc}$ is still the current in the load passing in the low-side driver 11, before this really enters an off state. The current value $I_{hc}$ is acquired at the time instant during which the driver receives the control command CMD to go off, CMD=0. Such high current value $I_{hc}$, thus, is acquired just before or synchronously with the issuance of an OFF command signal evaluating when the controllable switch 11 is still close.

In the negative, step 180 of evaluation of the duty cycle of the PWM signal is performed: if it is found that the duty cycle is 100%, then the high current $I_{hc}$ value is sampled in a step 195 and control returns to step 120. The condition verified at step 180, i.e., the duty-cycle of the PWM control signal CMD reaching 100% may occur for instance if the target current $I_{target}$ cannot be reached for some reason, or during a transient. Otherwise the high current $I_{hc}$ value is not sampled and control returns to step 160 where the median current $I_{mid}$ value was calculated, waiting for high current $I_{hc}$ sampling by CMD=0 or by PWM=100%.

Therefore, generally the method described herein provides for generating at a current controller module 35 the control signal CMD to switch on and off the controllable switch 11, including performing a PWM (Pulse Width Modulation) current control by a negative feedback closed loop, implementing at least a proportional control action and an integral control action and a PWM modulation, using as feedback loop set-point the target current value $I_{target}$ and as feedback measured value of the loop an estimated value $I_{mid}$ of the current flowing in the load $I_{LS}$ during a measurement PWM cycle, generating the control signal CMD for the control input of the controllable switch 11 on the basis of the error current $I_{error}$ between said target current $I_{target}$ and said estimate $I_{mid}$ of the current $I_{LS}$ flowing in the load 50. In the preferred embodiment described with reference to FIG. 5 the controllable switch is a low side switch.

As described with reference to FIG. 6, the method includes sensing by the sense circuit 11b the current in the controllable switch 11 and estimating in the module 32 on the basis of the sense current $I_{sense}$ the estimated value $I_{mid}$ of the current flowing in the load $I_{LS}$ during a measurement PWM cycle. Although alternate estimated values are possible, such as average ON current Iavgon or the sense current value at $T_{on}/2$, $I(T_{on}/2)$, in a preferred embodiment, which allows real time control, the estimation at module 32 includes in general calculating as the half of the sum of a low current value $I_{lc}$ acquired after the issuance of an ON command signal CMD in the measurement PWM cycle and a high current value $I_{hc}$ acquired 170 just before or synchronously with the issuance of an OFF command signal. It is noted that in preferred calculation of the median current Imid, a high current value $I_{hc}$ acquired before the low current value $I_{lc}$ is used.

In the embodiment specifically described with reference to FIG. 6 the low current value $I_{lc}$ is acquired in step 150 from the sense current $I_{sense}$ after the issuance of an ON command signal CMD in the measurement PWM cycle evaluating when the controllable switch 11 becomes closed, in particular after the settling of the sense current $I_{sense}$, the high current value $I_{hc}$ is acquired in a step 190 before the end of the previous OFF command signal evaluating when the controllable switch 11 becomes open. Then in step 160 the median current $I_{mid}$ value is obtained as the sum of the low current $I_{lc}$ and the high current $I_{hc}$ divided by two.

It is noted that if at step 180 the duty-cycle is found to be 100%, in that PWM cycle the control signal CMD does not return to zero, i.e., the driver is not switched off. Therefore, at the end of the PWM cycle, both $I_{hc}$ and $I_{lc}$ are sampled at the same time, thus taking the same value. In the subsequent PWM cycle, starting immediately after this sampling operation, the value of the median current $I_{mid}$ is calculated as equal to the value of these two samples, and the error $I_{error}$ input of the controller 15 is updated accordingly.

Therefore the solution here disclosed allows for implementing a fully integrated real-time PWM controller for the inductive load, where real time means that the controller is updated at each PWM cycle, with a latency lower than one PWM cycle. This solves therefore the problem that such a circuit topology in which the load current, when flowing through the external diode as diode current, since the low-side switch is off, cannot be measured by the control circuit and therefore the real average current with respect to the load current cannot be measured, since only the low side current is measurable.

A real time current control loop of this type is faster to react to system variations (such as battery voltage change), to recover to the correct steady state average current value, in particular with respect to solution such as the one depicted in FIG. 3, where the current flowing in the load is read only occasionally. As discussed, implementing a current-control algorithm operating on a PWM-period basis in that context would require quite a heavy SPI traffic load and significant work-load for the microprocessor.

The above advantages are obtained in a low-cost driving topology, using an external recirculation diode, which, as indicated, however allows real time current control, and, by the proportional integral control, allows better current control accuracy at low target current values. The better current control accuracy is particularly ensured by the use of the median current.

Of course, without prejudice to the principle of the invention, the details of construction and the embodiments may vary widely with respect to what has been described and illustrated herein purely by way of example, without thereby departing from the scope of the present invention, as defined by the ensuing claims.

In variant embodiments the controllable switch can be a high side switch and the recirculation diode connected accordingly to recirculate the current in the ground node.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit for controlling current in an inductive load, comprising:
 a driver circuit configured to drive a load current in said inductive load, said driver circuit including:
  a low side or high side controllable switch having a control input for receiving a control signal, the controllable switch is configured to be switched on to increase the load current flowing in the inductive load and switched off based on the control signal, wherein a recirculation diode, external to the driver circuit is arranged to re-circulate the load current when the controllable switch is switched off;

a negative feedback closed loop configured to implement at least one of proportional control and integral control, the negative feedback closed loop being configured to output a target current value and an estimated value of the current flowing in the inductive load during an immediately preceding measurement PWM cycle, the estimated value of the current flowing in the inductive load during the immediately preceding measurement PWM cycle being determined as a value of the current flowing in the inductive load at a mid-point of an on-time of the immediately preceding measurement PWM cycle; and a PWM current controller module configured to:
receive the target current value and the estimated value of the current flowing in the inductive load during the immediately preceding measurement PWM cycle;
generate a control signal based on an error between said target value and said estimated value of the current flowing in the load; and
output the control signal to the control input of the controllable switch.

2. The circuit according to claim 1 wherein said controllable switch is a low side switch having conductive terminals that are coupled to an output node and a ground node, respectively, and the recirculation diode is coupled in parallel with the inductive load and has a cathode that is coupled to a battery node that provides power supply.

3. The circuit according to claim 1, comprising:
a sense circuit coupled to the controllable switch and configured to sense the load current and supply a sense current to the negative feedback closed loop.

4. The circuit according to claim 1, wherein the negative feedback closed loop implements a derivative action.

5. A method for controlling current in an inductive load, comprising:
feeding back, by a negative feedback closed loop implementing at least proportional control and integral control, an estimated value of the current flowing in the inductive load during an immediately preceding measurement PWM cycle, the estimated value of the current flowing in the inductive load during the immediately preceding measurement PWM cycle being determined as a value of the current flowing in the inductive load at a mid-point of an on-time of the immediately preceding measurement PWM cycle;
generating a control signal to switch on and off a controllable switch based on an error between a target current and said estimated value of the current flowing in the inductive load; and
driving the load current in said inductive load based on the control signal by at least:
switching on the controllable switch to increase the current flowing in the inductive load;
switching off the controllable switch; and
in response to switching off the controllable switch, causing a recirculation diode to re-circulate the current in the inductive load when the controllable switch is switched off.

6. The method according to claim 5, wherein the controllable switch is a low side switch having a first conductive terminal coupled to an output node to the inductive load and a second conductive terminal coupled to a ground node, and wherein the recirculation diode is coupled in parallel with the inductive load and has a cathode that is coupled to a battery node.

7. The method according to claim 5, comprising:
sensing a current flowing through the controllable switch; and
estimating, based on said sensed current flowing through the controllable switch, said estimated value of the current flowing in the inductive load during the immediately preceding measurement PWM cycle.

8. The method according to claim 5 wherein said negative feedback closed loop implements a derivative action.

9. A system comprising:
an inductive load;
a diode coupled in parallel to the inductive load and having an anode coupled to a controller output node; and
a controller including:
a controllable switch having a first conductive terminal coupled to the controller output node, a second conductive terminal coupled to a ground node having a control terminal for receiving a control signal, the controllable switch is configured to be switched on to increase a load current flowing in the inductive load and switched off based on the control signal, wherein the diode re-circulates the load current when the controllable switch is switched off;
a feedback loop configured to output an estimated value of the load current flowing in the inductive load during an immediately preceding measurement PWM cycle, the estimated value of the current flowing in the inductive load during the immediately preceding measurement PWM cycle being determined as a value of the current flowing in the inductive load at a mid-point of an on-time of the immediately preceding measurement PWM cycle; and
a PWM current controller module configured to:
receive a target current value and the estimated value of the current flowing in the inductive load during the immediately preceding measurement PWM cycle;
generate the control signal based on an error between said target current and said estimated value of the current flowing in the inductive load; and
output the control signal to the control terminal of the controllable switch.

10. The system according to claim 9 wherein the diode has a cathode coupled to a voltage supply node that provides a voltage supply.

11. The system according to claim 9, comprising:
a current sense circuit coupled to the controllable switch and configured to sense the load current and provide a sensed current to the feedback loop, and wherein the feedback loop is configured to output the value of the load current based on the sensed current.

* * * * *